(12) United States Patent
Bennett et al.

(10) Patent No.: US 9,424,370 B2
(45) Date of Patent: Aug. 23, 2016

(54) SYSTEM AND METHOD FOR SPATIAL PARTITIONING OF CAD MODELS

(75) Inventors: Jeremy Bennett, Ames, IA (US); Michael B. Carter, Ames, IA (US)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 1793 days.

(21) Appl. No.: 12/630,318

(22) Filed: Dec. 3, 2009

(65) Prior Publication Data

US 2010/0235146 A1  Sep. 16, 2010

Related U.S. Application Data

(60) Provisional application No. 61/159,586, filed on Mar. 12, 2009.

(51) Int. Cl.
*G06F 17/50* (2006.01)
*G06T 17/10* (2006.01)

(52) U.S. Cl.
CPC ............ *G06F 17/50* (2013.01); *G06T 17/10* (2013.01)

(58) Field of Classification Search
CPC .............................. G06F 17/50; G06T 17/10
USPC ......................................... 703/1; 700/97, 182
See application file for complete search history.

(56) References Cited

U.S. PATENT DOCUMENTS

| | | | | |
|---|---|---|---|---|
| 6,483,518 | B1 * | 11/2002 | Perry et al. | 345/590 |
| 2002/0135577 | A1 * | 9/2002 | Kase | G06T 17/005 345/424 |
| 2005/0075847 | A1 * | 4/2005 | Yamada et al. | 703/2 |
| 2010/0042676 | A1 * | 2/2010 | Seroussi et al. | 709/203 |

FOREIGN PATENT DOCUMENTS

| | | |
|---|---|---|
| EP | 0643355 A2 | 3/1995 |
| WO | WO 2009044282 A2 | 4/2009 |

OTHER PUBLICATIONS

Samet, Hanan, "Spatial Data Structures", 1995, Modern Database Systems: The Object Model, Interoperability and Beyond, Addison Wesley/ACM Press.*
Conti, Paolo et al., "Omega—An Octree-Based Mixed Element Grid Allocator for the Simulation of Complex 3-D Device Structures", Oct. 1991, IEEE Transactions on Computer-Aided Design, vol. 10, No. 10.*

(Continued)

*Primary Examiner* — Cedric D Johnson (57) ABSTRACT

A method and related CAD system and computer readable medium. A method includes loading an object model in a CAD system, the object model including a plurality of parts each of which may contain one or more shapes which in turn are composed of multiple polygons. The method includes adding the shapes to a spatial tree, the shapes each corresponding to at least one cell, each cell corresponding to a spatial region of the object model. The method also includes, for each cell that is too complex to process within a memory space of the CAD system, subdividing the cell into a plurality of subcells using a first subdivision process. The method also includes subdividing each cell into a plurality of subcells using a multi-threaded subdivision process, and combining the subcells into the spatial tree.

21 Claims, 3 Drawing Sheets

(56) References Cited

OTHER PUBLICATIONS

Chen, Yong et al., Layer Depth-Normal Images for Complex Geometries—Part One: Accurate Modeling and Adaptive Sampling, Aug. 3-6, 2008, ASME 2008 International Design Engineering Technical Conferences and Computers and Information in Engineering Conference.*
Bennett, Jeremy S., "Massive Model Visualization: An Investigation into Spatial Partitioning", Jan. 1, 2009, Iowa State University.*
B. Bruderlin, et al., "Visibility-guided Rendering for Real Time Visualization of Extremely Large Data Sets", Eurographics Tutorial; 3dInteractve GmbH, Ilmenau & Technical University Ilmenau Sep. 4, 2006; 54 pages.
M. MeiBner, et al., "Generation of Subdivision Hierarchies for Efficient Occlusion Culling of Large Polygonal Models", WSI-99-13, 1999, 13 pages.
B. Bruderlin et al., "Visibility-guided Rendering to Accelerate 3D Graphics Hardware Performance"; San Diego, California; SIGGRAPH (2007); Technical University of Ilmenau; pp. 108-132.
D. Aliaga et al., "A Framework for Real-Time Walkthroughs of Massive Models. Technical Report" TR98-013, Department of Computer Science, University of North Carolina (1998); pp. 1-12.
D. Aliaga et al., "MMR: An Interactive Massive Model Rendering System Using Geometric and Image-based Acceleration" Department of Computer Science, University of North Carolina (1999). 9 pages.

J.D. MacDonald et al., "Heuristics for Ray Tracing Using Space Subdivision. The Visual Computer" (1990) pp. 6:153-166.
Havran, V. "Analysis of Cache Sensitive Representations for Binary Space Partitioning Trees" Czech Technical University in Prague; Department of Computer Science; Informatica 17 pp. 1-8.
R. Bogart, et al., Re: "Ray/triangle Intersection with Barycentric Coordinates" in Ray Tracing News: V1(1988); http://tog.acm.org/resources/RTNews/html/rtnews5b.html#art3; pp. 1-20.
E Gobbetti et al.; Far Voxels: "A Multiresolution Framework for Interactive Rendering of Huge Complex 3D Models on Commodity Graphics Platforms" CRS4—Visual Computing Group; 8 pages.
D. Kasik, et al., Course Notes: "State-of-the-art in Massive Model Visualiztion", 203 pages.
B. Chamberlain et al., "Fast Rendering of Complex Environments Using a Spatial Hierarchy"; University of Washington; 10 pages.
Bartz, et al. Published in International Conference in Central Europe on Computer Graphics and Visualization, In Cooperation with IFIP Working Group on Computer Graphics and Virtual World. Conference Proceedings, vol. 3, Feb. 9, 1998 (pp. 479-486); Magazine.
Lauterbach, et al. Published in IEEE Symposium on Interactive Ray Tracing, Sep. 1, 2006 (pp. 39-46); Magazine.
Yoon, et al. Published in the Visual Computer; International Journal of Computer Graphics, Springer, vol. 22, No. 9-11, Aug. 25, 2006 (pp. 772-784); Magazine.

* cited by examiner

SYSTEM AND METHOD FOR SPATIAL PARTITIONING OF CAD MODELS

CROSS-REFERENCE TO OTHER APPLICATION

This application claims priority from U.S. Provisional Patent Application 61/159,586, filed Mar. 12, 2009, which is hereby incorporated by reference.

TECHNICAL FIELD

The present disclosure is directed, in general, to systems and methods for computer-aided design, manufacturing, engineering, modeling, and visualization (individually and collectively, "CAD" and "CAD systems"), and related data storage and manipulation techniques.

BACKGROUND OF THE DISCLOSURE

Many current CAD systems use methods developed for Large Model Visualization (LMV), that revolve around loading model geometry in semantically-organized units of "parts" corresponding one-to-one with CAD drawings or models.

SUMMARY OF THE DISCLOSURE

Various embodiments include a method and related CAD system and computer readable medium. In one embodiment, a method includes loading an object model in a CAD system, the object model including a plurality of shapes. The method includes adding the constituent polygons of the shapes to a spatial tree, the spatial tree configured to manage a plurality of cells. Each polygon can correspond to at least one cell, and each cell can correspond to a spatial region of the object model. The method also includes, for each cell that is too complex to process within a memory space of the CAD system, subdividing the cell into a plurality of subcells using a first subdivision process. The method also includes subdividing each cell into a plurality of subcells using a multi-threaded subdivision process, and combining the subcells into the spatial tree.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1:
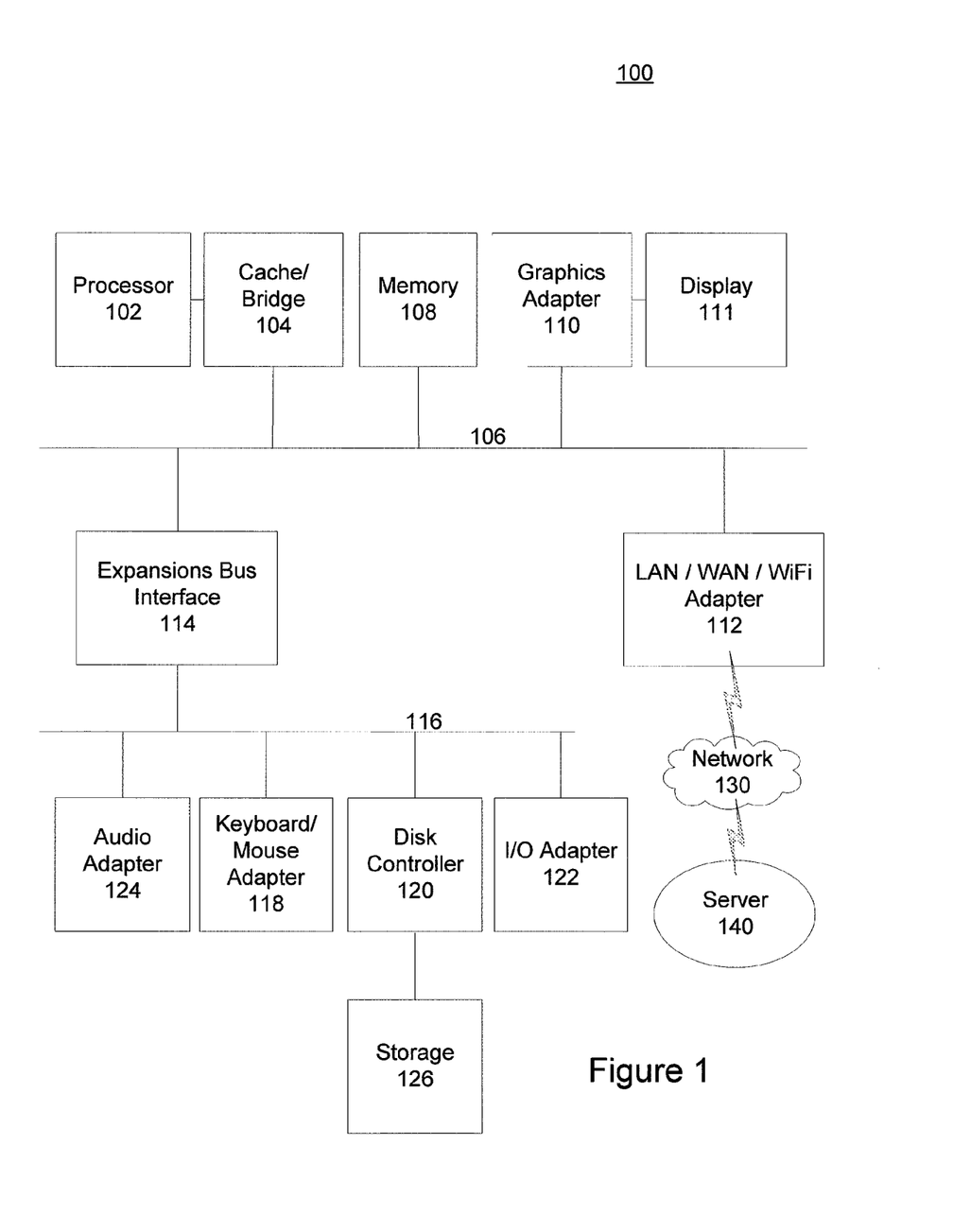
FIG. 1 depicts a block diagram of a data processing system in which an embodiment can be implemented.
Figure 2:
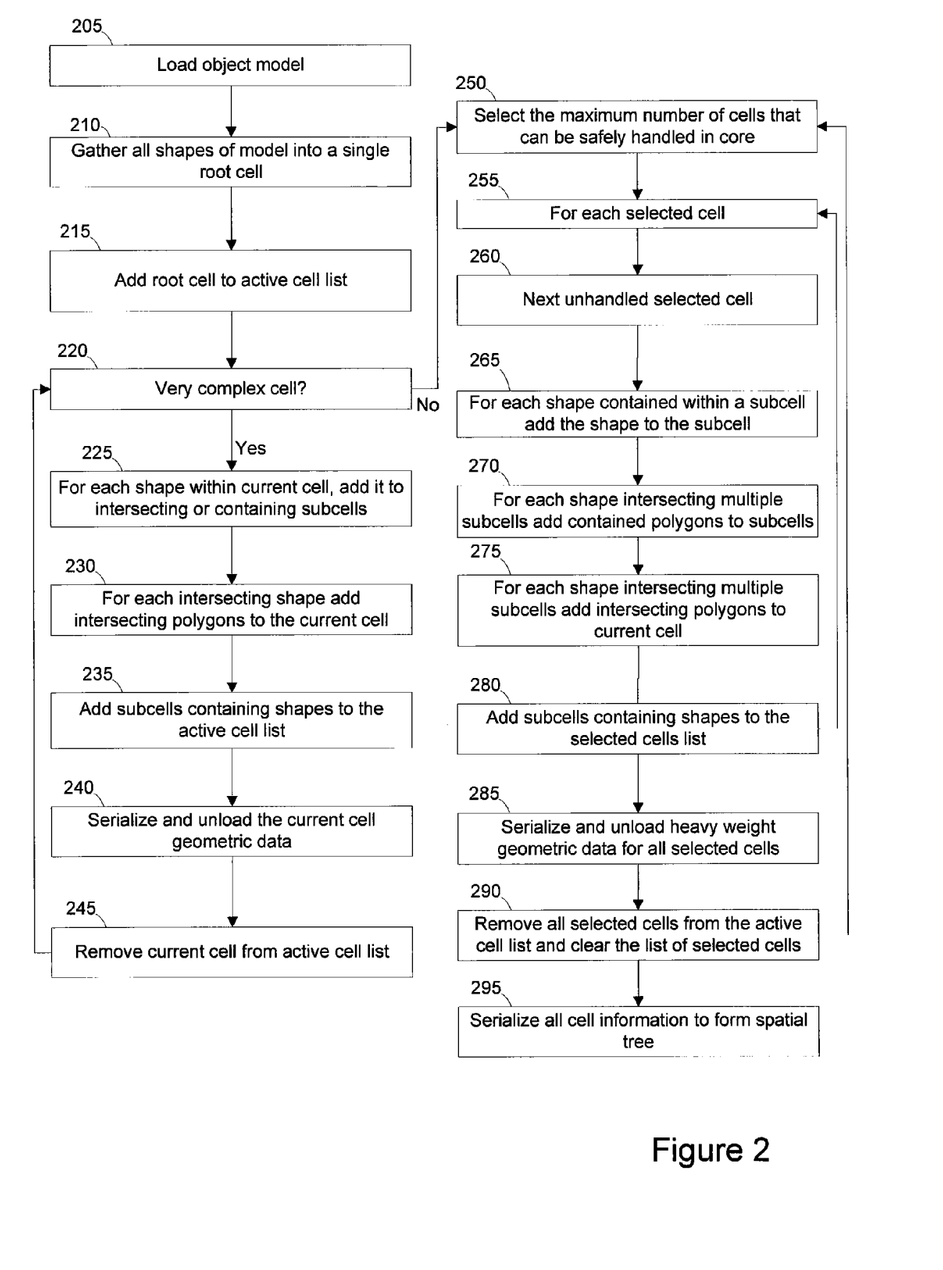
FIG. 2 depicts a flowchart of a spatial partitioning process in accordance with disclosed embodiments.
Figure 3:
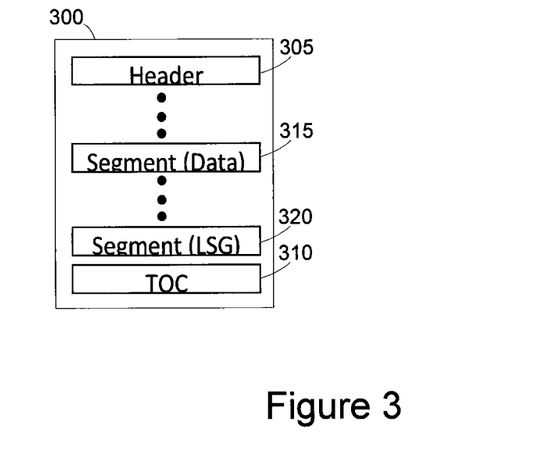
FIG. 3 depicts an example of a data format in accordance with various embodiments.

FIGS. 1 through 3, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Massive model visualization (MMV) is the ability to use visualization software to interact with arbitrarily large size models on commodity hardware. The amount of data that must be handled by such systems is growing at an alarming rate and is already outpacing the gains in computational capabilities of both CPUs and GPUs. Further, both memory bandwidth and data access are growing at substantially slower speeds and it easy to see that current methods will eventually reach the point of no longer being adequate.

Large Model Visualization (LMV) is focused on loading model geometry in semantically-organized units of "parts" corresponding one-to-one with CAD drawings or models The LMV scheme works well for models up to about 10,000 parts. Above this size, LMV consumes an increasingly unacceptable amount of time and data bandwidth to be able to effectively present or interact with the whole model.

In contrast to this methodology, the MMV techniques can give a user nearly-immediate access to the whole model straightaway without having to load tens of thousands of discrete parts. MMV relies on a spatial data organization to effect this key capability, as opposed to the semantic organization of LMV schemes. The novel systems and methods disclosed herein allow effective pre-processing of a massive model database into a spatially-organized database required by MMV visualization methods.

FIG. 1 depicts a block diagram of a data processing system in which an embodiment can be implemented, for example as a CAD system for performing the techniques disclosed herein. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111. Processor 102 can be implemented as multiple processors and/or use multiple cores, and preferably supports multiple execution threads.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary for particular. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be, connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

One difficulty in working with arbitrarily large size models is that they are often so large that it is impractical if not impossible to load them completely into memory. The use of product hierarchies helps to alleviate this issue by allowing for parts and assemblies to be dynamically loaded/unloaded and culled from what is actually rendered, however this scheme can only go so far. The assemblies and components of a product structure are often organized around systems which often have parts that interleave and wrap around one another. While this generally works well within the design process, it causes issues when trying to efficiently manage the data.

Often only a small subsection of a given sub-assembly or part is actually visible within a frame while the rest is obscured, and so a lot of data is loaded but is not being used. Further, the sub-assemblies and parts have no implicit relationship to one another when it comes to advanced culling techniques like frustum, screen coverage, and occlusion. When using a product hierarchy, the run-time of these processes is therefore bounded by the size of the model; as the model grows to an arbitrary large size so will the amount of time it will take to complete these algorithms.

The disclosed techniques address these issues in part by generating a new data structure to represent the product. The disclosed structure helps limit the amount of loaded geometric data while at the same time bounding the culling algorithms to only those things that are currently visible. A spatial hierarchy is a way of organizing data such that two things which are near one another in space remain near one another in the data structure. Having such a data structure greatly aids in quickly performing the culling tasks because large swaths of the hierarchy can quickly be culled and the detailed processing limited to only those areas where it is truly needed. Further, since the model is divided into spatial cells, the amount of data loaded can be limited to only those cells that are visible and therefore exclude all the geometry that is not visible.

Spatial partitioning is the process by which a model is sub-divided into a spatial hierarchy. There are many different approaches for solving this problem; however they are not all equal. The techniques disclosed herein allow for arbitrarily large models to be extracted into a spatial hierarchy that, maintain connectivity information between individual geometric primitives (including but not limited to triangles and other polygons) and their original parts and maintains high performance and a low memory turnover. A part of a model may include one or more shapes, each composed of one or more geometric primitives.

Massive model visualization is a relatively young field that is quickly gaining traction throughout research institutions and industry.

FIG. 2 depicts a flowchart of a spatial partitioning process in accordance with disclosed embodiments. Various steps are described in more detail below.

The CAD system loads an object model including a plurality of shapes (step 205).

The model can include an arbitrarily large number of shapes. Loading the object model can be performed in a number of ways, including loading the model from storage or receiving it from another system.

The CAD system finds all shapes contained within the model and adds them to the root cell of a spatial tree in a data gathering process (step 210).

The system adds the root cell to an active cell list (step 215).

For each active cell, the system determines whether the complexity of the cell would result in the memory limit being exceeded in the processing described below (steps 250-295). This check is independent of multithreading or single-threading, and is based on whether or not the cell and all of its potential subcells can exist within memory based upon the shapes and polygons currently held within the cell.

If so, the system executes an initial sub-division or partitioning process on the cell in order to ensure that the memory limit is not exceeded. Partitioning is the process by which cell contents such as shapes or polygons are subdivided into subcells. Preferably, a cell is only partitioned if its complexity exceeds the desired per-cell complexity limit This limit is set such that geometric primitives will be sufficiently partitioned to allow for efficient culling. In essence, the limit ensures that more-complex regions are partitioned into more cells than less-complex regions in order to compensate for the extra geometric primitives.

For each shape within the current cell, the system adds the shape to any subcells that contains or intersect the shape (step 225). For each shape that is intersected, the system adds the intersecting polygons to the current cell (step 230). After the above is complete, the system then adds any subcells containing shapes to the active cells list (step 235). The system then writes the geometric data to permanent data store, for example in an SJT structure as described below, in a process also known as serialization, and the system unloads this data to free the memory (step 240). The system finishes the process by removing the cell from the active cell list (step 245) and repeats it as necessary until there are no remaining active cells that meet the above criteria.

The process described in steps 225-245 is single-threaded process that ensures the partitioning stays in-core or rather with the limits of the system resources. In particular, this process ensures that the memory limit will not be exceeded while handling cells even when dealing with an arbitrarily large root cell. This can be important since exceeding the memory limit by even just a little can result in severe performance degradations and exceeding it by a lot can result inability to generate a spatial hierarchy. In-core, as used herein, means within the resource limits of the system or in the context of this system below or equal to the available system memory. Out-of-core means beyond the resource limits of the system or in the context of this system above outside the available system memory Once the initial subdivision process is complete, a primary sub-division or partitioning process is executed by the system on all remaining active cells. As described above, in various embodiments, a cell is only partitioned (or selected to be partitioned) if its complexity exceeds the desired per-cell complexity limit.

The system selects the maximum number of cells that can be handled (step 250) while remaining below the memory limit. Steps 255-290, as described herein, are performed by the system for each selected cell (step 255). This process can occur in parallel with each individual cell being handled on its own thread. The maximum number of threads is bound by the available processing cores and therefore can be anywhere from one to an arbitrary number of cores. This allows for the processing to achieve optimum performance in current and future generations of hardware.

The system assigns the next unhandled selected cell to a processing thread (step 250). For each shape in a selected cell that is completely contained within a subcell the system adds the shape to the subcell (step 265). For each shape in a selected cell that intersects multiple subcells the system adds any polygons contained in the cell to any subcells that contain the respective polygon (step 270). For each shape in the selected cell, the system adds any polygons that intersects multiple subcells to the current cell (step 275). The system then adds any subcells that contain polygons to the list of selected cells (step 280). The system then repeats to step 255 for any remaining selected cells, or else continues to step 285.

After all selected cell have been processed through steps 255-280, the system serializes the cells by writing the geometric data to a permanent data store (see SJT below, for example) and unloads this data to free the memory (step 285). The system then removes the selected cells from the active cell list, clearing the list of selected cells (step 290), and then repeats to step 250 if there are still active cells; otherwise the process moves on to step 295.

As a final step, the system serializes all cell information by writing the cell connectivity information to a permanent data store to capture the resulting spatial tree such that it can be loaded into another system (step 295).

The processes described above for partitioning the cells into subcells automatically creates an ordering of cells in the spatial tree that represents a spatial hierarchy. The resulting spatial tree, stored in the data processing system, provides a significant advantage to known systems, and can then be used by other CAD systems or applications for further efficient processing of the object model.

The various embodiments disclosed herein can include specific processes and features as described, and can use the specific techniques, processes, and structures described below.

Data Gathering: The input data in the loaded object model is usually organized in product hierarchy which often contains more than just geometric information. In order to facilitate efficient partitioning it is necessary to gather a list of all the shapes. This operation can be expensive since it requires that all assemblies be opened and searched for their shapes and also carries the side effect of increasing the amount of memory in use, however this should be minimal since the heavy-weight shape data not need to be loaded. Once all the shapes have been collected the spatial hierarchy can be subdivided.

Sub-division processes: Spatial hierarchies are powerful data structures because they allow a model be subdivided based upon the spatial locality of its data. The splitting or subdividing of a cell simply entails subdividing the region encompassed by the cell into smaller sub-regions which are stored as subcells representing smaller sub regions.

Any full shapes that do not fit within a single subcell are split into polygons and handled as such. Any polygons or shapes that can be contained by a subcell are automatically removed from the parent and are pushed to the subcell. Polygons that do not fit into a single cell can be handled in many different ways depending upon the implementation of the spatial hierarchy. In various embodiments, approaches include splitting the polygons so that smaller polygons are added to each of the intersected cells, leaving the polygons on the current cell, and a hybrid where large polygons are left on the current cell and smaller polygons are added to all intersected cells. Of course, the term "polygons" as used here includes any similar geometric primitives.

Preferably, during the secondary partitioning process described above, shapes are only split into individual polygons when absolutely necessary to keep the memory usage low. However when handling arbitrarily large models this may not be enough, particularly when the number of shapes to be split is so large that will result in the memory limit being exceeded.

A secondary sub-division process is used while the complexity of any given cell is considered to be so large that splitting the cell in the normal manner would result in a preset memory limit being exceeded. The main issue is that splitting a shape results in its heavy-weight geometric data being loaded and copied throughout the subcells. Loading is not so much an issue since the shapes geometric data can be unloaded as soon as the algorithm is done with them, however the same is not true about the polygons copied into the subcells. In the secondary sub-division process, the system adds any intersecting shapes to the subcells to be handled when they are sub-divided and only appends polygons from shapes that are not contained within a single subcell to the current cell. This approach is acceptable because the amount of polygons that can potentially stay resident on the current cell is relatively small and further once the subdivision of the current cell is complete, its geometric data can be stored in the CAD system and unloaded.

Multi-Threading: In order to take advantage of modern computing resources, the processes described herein preferably execute in a multi-threaded fashion. Doing so isolates core operations such that the available work is distributed over an unknown number of execution threads. The spatial subdivision approach described above guarantees that each cell in the spatial hierarchy can be processed independently of other cells once it has been initially set up. Once a collection of cells has been established, they can easily be distributed among multiple threads for further splitting without risk of collision between cells.

In order to facilitate multi-threading, various embodiments of the partitioning processes described herein are designed to work on a spatial tree that is defined only by its root cell and bounding box. The power of this is that each cell in a given spatial tree is in fact the root cell of its own spatial tree. This means partitioning only needs to split cells in a single threaded fashion until it has a large enough pool of cells whose complexities are small that they can be effectively distributed to the maximum number of threads for processing as their own spatial trees. Once complete the resulting trees from the processed cells can easily be combined back together into a single spatial tree.

One key obstacle to this approach is ensuring the initial set of selected cells is split sufficiently so as to ensure that the workload is evenly balanced amongst the available threads. The naive approach used in some embodiments is to just partition cells until the number waiting to be handled is greater than or equal to the number of available threads. This approach does not attempt to balance the work load and therefore some threads are likely to finish their work long before the others are done. In some embodiments, the system can first sort the cells in order of complexity so that highly complex cells are handled by different threads. This is a step that should preferably occur after selecting cells, but before doing the multithread processing in steps 250-290

A preferred approach, used in some embodiments, is to split any selected cell whose complexity is greater than the total complexity of all selected cells divided by the number of available threads before sorting them in order of complexity and then ensuring that all threads will continue working while there are stills cell waiting to be processed. This ensures that even under a worst case scenario of thread spending its whole time handling a single cell that the others threads will have already handled or be handling the other cells.

Data Format: Various embodiments take full advantage of spatial hierarchy one by using a data structure that allows for efficient loading and unloading of cell data based upon what is currently visible to the user. Since massive models often times are so large that they are incapable of fitting into host memory, this data structure is designed such that it can be created in streaming fashion with the heavy weight geometric data of cells being serialized into their own data segment independent of other segments and further unloaded as soon as possible during the spatial partitioning process. For out of core cells, the cells are serialized and unloaded immediately after being processed. For multithreaded processing of in-core cells, the selected cells are all processed and then serialized/unloaded.

The above tasks can be accomplished by making use of data model and structures based on the JT data format developed by Siemens PLM Software Inc. The JT data format is regarded as the de facto standard for 3D visualization finding widespread usage throughout automotive, aerospace, and other industries, and is well known to those of skill in the art. It is a high-performance, extremely compact persistent storage representation that can be customized to be extremely light weight, containing only facet information, or full-featured depending upon the users need. Furthermore, the JT data format natively supports the capability of being able to late-load both the facet information and heavy-weight data as needed by the hosting application. These mechanisms provide the basis for a Spatial JT (SJT) file format that can be advantageously used in various embodiments disclosed herein.

FIG. 3 depicts an example of an SJT data format 300 in accordance with various embodiments. SJT follows the same data model as the JT file format containing a header 305, table of contents (TOC) 310, and multiple data segments 315, one of which is a logical scene graph (LSG) 320. Segments are discrete data blocks that allow information that may not always necessary to be loaded/unloaded as needed. For example heavy weight information such as shape geometric data is stored in its own segment and is only actually loaded into memory if needed for processing or rendering.

The header 305 provides access to the version information, the byte order of the file, and the offset to both the TOC and the LSG.

The table of contents 310 contains a list of all the segments 315 in the file. The segment information is stored as TOC entries that contain a unique identifier, segment type, segment length, and the offset within the file to the segment. When possible, the TOC is stored immediately after the header in order to improve performance when files are being hosted by a server. However this is not always possible, especially when streaming data into the file, so the TOC can also appear at the end of the file.

The logical scene graph segment 320 of an SJT file contains all the data required to reconstruct the spatial tree and to be able to dynamically load the other data segments. The header points to the LSG so that it can be loaded immediately upon opening a file.

The data segments 315 in SJT structure contain the geometric data associated with each cell. This data can be loaded or unloaded when needed by the application in order conserve the amount of memory in use. In order to minimize the file size and limit the amount of data that must be written to and read from the disk, geometric data can be written using topological compression techniques introduced in the JT v9.x file format.

The segment data structure allows for segments to be written to the file in any order. Further once a segment is has been written its payload can be unloaded from memory since it can easily be loaded at a later point in time. This means that serialization can occur in an incremental fashion as cells are handled and further by utilizing this capability to its fullest the amount of memory is use while partitioning can minimalized.

Part Associativity: Each part can contain one or more shapes, which in turn includes one or more polygons or geometric primitives. One of the key disadvantages to partitioning a product structure into a spatial hierarchy is that the polygons associated with any given part can potentially be dispersed across multiple cells. This poses a potential problem since there many common operations that must be supported in a spatial hierarchy based viewer that depend upon knowing part identity. Thus, the disclosed spatial partitioning processes operate so that the originating part of any polygon within the spatial hierarchy can easily be identified.

Each cell organizes its polygons into sub-groups with each sub-group containing polygons only from one part. Note that multiple cells may contain different subsets of a given part's polygons. Each of these sub-groups, in turn, has an associated unique part ID. This unique part ID corresponds to the part from which the polygons came. Thus, any given polygon, anywhere in the spatial hierarchy can be quickly associated to its originating part.

Various embodiments include a method and related CAD system and computer readable medium. In one embodiment, a method includes loading an object model in a CAD system, the object model including a plurality of shapes. The method includes adding the constituent polygons of the shapes to a spatial tree, with each polygon corresponding to at least one cell, each cell corresponding to a spatial region of the object model. The method also includes, for each cell that is too complex to process within a memory space of the CAD system, subdividing the cell into a plurality of subcells using a first subdivision process. The method also includes subdividing each cell into a plurality of subcells using a multi-threaded subdivision process, and combining the subcells into the spatial tree.

Other related techniques and systems are known to those of skill in the art, and are all hereby incorporated by reference: Kasik, D. (2007). *Visibility-guided rendering to accelerate 3D graphics hardware performance*. San Diego, Calif.: SIGGRAPH '07; Aliaga, D., Cohen, J., Wilson, A., Baker, E., Zhang, H., Erikson, C., et al. (1998). *A framework for real-time walkthroughs of massive models*. Technical Report TR98-013, Department of Computer Science, University of North Carolina; Aliaga, D., Cohen, J., Wilson, A., Baker, E., Zhang, H., Erikson, C., et al. (1999). *MMR: an interactive massive model rendering system using geometric and image-based acceleration*. (pp. 199-206). Symposium on Interactive 3D Graphics; MacDonald, J. D., & Booth, K. S. (1990). *Heuristics for ray tracing using space subdivision*. The Visual Computer, 6 (6), pp. 153-165; Harvan, V. (1999). *Analysis of cache sensitive representations for binary space partitioning trees*. Informatica, 29 (3), pp. 203-210; Arenberg, J. (1988). *Re: Ray/triangle intersection with barycentric coordinates*. Ray Tracing News, 1; Gobbetti, E., & Marton, F. (2005). Far Voxels: *A Multiresolution Framework for Interactive Rendering of Huge Complex 3D Models on Commodity Graphics Platforms*. 24, pp. 878-885. ACM Transactions on Graphics; Wikipedia. (n.d.). *Spatial partitioning*. Retrieved from Wikipedia on date of filing at en.wikipedia.org/wiki/Space_partitioning.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of a instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method, comprising:
    loading an object model in a CAD system, wherein the object model includes a plurality of shapes;
    adding the shapes to a cell in a spatial tree in the CAD system, the spatial tree configured to manage a plurality of cells;
    determining whether each cell is too complex to process within a memory space of the CAD system, and based on the determination, for each cell that is too complex to process within the memory space, subdividing the cell into a plurality of subcells using a first subdivision process, the determination based at least on whether or not each cell and potential subcells of that cell can exist within the memory space based upon shapes currently held within that cell;
    subdividing each cell into a plurality of subcells using a multi-threaded subdivision process by the CAD system; and
    combining the subcells into the spatial tree stored in the CAD system.

2. The method of claim 1, wherein the spatial tree is stored in the CAD system using a plurality of data structures each having a header, a table of contents, a logical scene graph segment, and a plurality data segments.

3. The method of claim 2, wherein each cell of the spatial tree is stored in the CAD system using a different one of the plurality of data structures.

4. The method of claim 1, wherein each of the subcells stores geometric data corresponding to shapes completely contained in the respective subcell.

5. The method of claim 1, wherein each of the subcells stores geometric data corresponding to shapes completely contained in the respective subcell.

6. The method of claim 1, wherein each subcell corresponds to a spatial subregion of a parent cell.

7. The method of claim 1, wherein a portion of memory of the CAD system allocated to a cell is de-allocated after that cell is subdivided into subcells.

8. A CAD system comprising at least one processor and an accessible memory, the at least one processor capable of simultaneously executing multiple processing threads, the CAD system particularly configured to perform the steps of:
loading an object model, wherein the object model includes a plurality of shapes;
adding the shapes to a spatial tree, the shapes each corresponding to at least one cell, each cell corresponding to a spatial region of the object model;
determining whether each cell is too complex to process within a memory space, and based on the determination, for each cell that is too complex to process within the memory space, subdividing the cell into a plurality of subcells using a first subdivision process, the determination based at least on whether or not each cell and potential subcells of that cell can exist within the memory space based upon shapes currently held within that cell;
subdividing each cell into a plurality of subcells using a multi-threaded subdivision process; and
combining the subcells into the spatial tree.

9. The CAD system of claim 8, wherein the spatial tree is stored in the CAD system using a plurality of data structures each having a header, a table of contents, a logical scene graph segment, and a plurality data segments.

10. The CAD system of claim 9, wherein each cell of the spatial tree is stored in the CAD system using a different one of the plurality of data structures.

11. The CAD system of claim 8, wherein each of the subcells stores geometric data corresponding to shapes completely contained in the respective subcell.

12. The CAD system of claim 8, wherein each of the subcells stores geometric data corresponding to shapes completely contained in the respective subcell.

13. The CAD system of claim 8, wherein each subcell corresponds to a spatial subregion of a parent cell.

14. The CAD system of claim 8, wherein a portion of memory of the CAD system allocated to a cell is de-allocated after that cell is subdivided into subcells.

15. A non-transitory computer-readable medium storing computer executable instructions that, when executed, cause a CAD system to perform the steps of:
loading an object model, wherein the object model includes a plurality of shapes;
adding the shapes to a cell in a spatial tree, the spatial tree configured to manage a plurality of cells;
determining whether each cell is too complex to process within a memory space, and based on the determination, for each cell that is too complex to process within the memory space, subdividing the cell into a plurality of subcells using a first subdivision process, the determination based at least on whether or not each cell and potential subcells of that cell can exist within the memory space based upon shapes currently held within that cell;
subdividing each cell into a plurality of subcells using a multi-threaded subdivision process; and
combining the subcells into the spatial tree.

16. The computer-readable medium of claim 15, wherein the spatial tree is stored in the CAD system using a plurality of data structures each having a header, a table of contents, a logical scene graph segment, and a plurality data segments.

17. The computer-readable medium of claim 16, wherein each cell of the spatial tree is stored in the CAD system using a different one of the plurality of data structures.

18. The computer-readable medium of claim 15, wherein each of the subcells stores geometric data corresponding to shapes completely contained in the respective subcell.

19. The computer-readable medium of claim 15, wherein each of the subcells stores geometric data corresponding to shapes completely contained in the respective subcell.

20. The computer-readable medium of claim 15, wherein each subcell corresponds to a spatial subregion of a parent cell.

21. The computer-readable medium of claim 15, wherein a portion of memory of the CAD system allocated to a cell is de-allocated after that cell is subdivided into subcells.

* * * * *